United States Patent
Stanley

(10) Patent No.: US 9,456,508 B2
(45) Date of Patent: Sep. 27, 2016

(54) METHODS FOR ASSEMBLING ELECTRONIC DEVICES BY INTERNALLY CURING LIGHT-SENSITIVE ADHESIVE

(75) Inventor: Craig Matthew Stanley, Santa Clara, CA (US)

(73) Assignee: Apple Inc., Cupertino, CA (US)

( * ) Notice: Subject to any disclaimer, the term of this patent is extended or adjusted under 35 U.S.C. 154(b) by 1546 days.

(21) Appl. No.: 12/790,732

(22) Filed: May 28, 2010

(65) Prior Publication Data

US 2011/0292623 A1 Dec. 1, 2011

(51) Int. Cl.
| | |
|---|---|
| H05K 7/00 | (2006.01) |
| H05K 5/00 | (2006.01) |
| B29C 45/16 | (2006.01) |
| B29C 65/48 | (2006.01) |
| H05K 3/32 | (2006.01) |
| B29C 65/00 | (2006.01) |
| F16B 11/00 | (2006.01) |
| B29C 65/14 | (2006.01) |

(52) U.S. Cl.
CPC ............ *H05K 5/0004* (2013.01); *B29C 45/16* (2013.01); *B29C 65/4845* (2013.01); *B29C 66/5326* (2013.01); *B29C 66/542* (2013.01); *H05K 3/321* (2013.01); *B29C 65/1406* (2013.01); *B29C 65/149* (2013.01); *B29C 65/1435* (2013.01); *B29C 65/4825* (2013.01); *B29C 66/1122* (2013.01); *F16B 11/006* (2013.01); *H05K 2201/10106* (2013.01)

(58) Field of Classification Search
USPC .............................. 257/98, E33.056, E21.502
See application file for complete search history.

(56) References Cited

U.S. PATENT DOCUMENTS

| | | | | |
|---|---|---|---|---|
| 4,308,296 | A * | 12/1981 | Chitouras ...................... | 427/505 |
| 5,106,441 | A * | 4/1992 | Brosig et al. ................. | 156/104 |
| 5,632,551 | A * | 5/1997 | Roney et al. ................. | 362/485 |
| 5,771,254 | A * | 6/1998 | Baldwin et al. ................ | 372/31 |
| 5,892,203 | A * | 4/1999 | Jordan et al. ................. | 219/393 |
| 6,081,071 | A * | 6/2000 | Rogers .......................... | 313/512 |
| 6,104,565 | A * | 8/2000 | Bruner et al. .................. | 360/69 |
| 6,144,157 | A * | 11/2000 | Rogers et al. ................. | 313/512 |
| 6,171,105 | B1 * | 1/2001 | Sarmadi .......................... | 433/29 |
| 6,249,370 | B1 * | 6/2001 | Takeuchi et al. ............. | 359/291 |
| 6,319,433 | B1 * | 11/2001 | Kohan ......................... | 264/1.32 |
| 6,345,903 | B1 * | 2/2002 | Koike et al. .................. | 362/241 |
| 6,376,148 | B1 * | 4/2002 | Liu et al. ................... | 430/124.4 |
| 6,418,250 | B1 * | 7/2002 | Corbosiero et al. ............ | 385/24 |

(Continued)

*Primary Examiner* — Hoa C Nguyen
*Assistant Examiner* — Xanthia C Cunningham
(74) *Attorney, Agent, or Firm* — Treyz Law Group, P.C.; G. Victor Treyz; Zachary D. Hadd

(57) ABSTRACT

Assemblies of structures such as electronic device assemblies may be connected using light-cured liquid adhesive such as ultraviolet-light-cured adhesive. Light sources such as ultraviolet-light light-emitting diodes may be mounted to a substrate such as a printed circuit board substrate. The substrate may be mounted to an assembly formed from a plurality of structures. The structures may be connected to each other to form an interior cavity within which the substrate and light-emitting diodes are contained. A connector may be included in the assembly. The connector may have input-output pins. Conductive paths may couple the input-output pins to the light-emitting diodes in the cavity. A tool may be used to apply signals to the light-emitting diodes to activate the light-emitting diodes. The light-emitting diodes produce light that cures the adhesive. The light-emitting diodes may be disabled by blowing a fuse after the adhesive has been cured.

20 Claims, 12 Drawing Sheets

(56) References Cited

U.S. PATENT DOCUMENTS

| | | | |
|---|---|---|---|
| 6,449,406 B1* | 9/2002 | Fan et al. | 385/17 |
| 6,453,083 B1* | 9/2002 | Husain et al. | 385/17 |
| 6,608,724 B2* | 8/2003 | Liu et al. | 359/811 |
| 7,033,910 B2 | 4/2006 | Faris | |
| 7,135,090 B2* | 11/2006 | Cheng et al. | 156/379.8 |
| 7,195,687 B2* | 3/2007 | Hayashi et al. | 156/241 |
| 7,276,132 B2* | 10/2007 | Davies et al. | 156/148 |
| 7,351,368 B2* | 4/2008 | Abrams | 264/241 |
| 7,372,535 B2* | 5/2008 | Tashiro et al. | 349/187 |
| 7,427,332 B2* | 9/2008 | Takemoto et al. | 156/275.5 |
| 7,458,729 B2* | 12/2008 | Sasaki et al. | 385/55 |
| 7,498,062 B2* | 3/2009 | Calcaterra et al. | 427/430.1 |
| 7,511,313 B2* | 3/2009 | Nakata et al. | 257/98 |
| 7,553,582 B2* | 6/2009 | Bates | 429/57 |
| 7,933,019 B2* | 4/2011 | Chung et al. | 356/445 |
| 8,461,613 B2* | 6/2013 | Chou et al. | 257/99 |
| 2002/0005819 A1* | 1/2002 | Ronzani et al. | 345/8 |
| 2003/0178134 A1* | 9/2003 | Muramoto et al. | 156/285 |
| 2004/0050485 A1* | 3/2004 | Speer et al. | 156/272.2 |
| 2004/0134603 A1* | 7/2004 | Kobayashi et al. | 156/272.8 |
| 2004/0166234 A1* | 8/2004 | Chua et al. | 427/64 |
| 2004/0238111 A1* | 12/2004 | Siegel | 156/275.5 |
| 2005/0139309 A1 | 6/2005 | Savoie et al. | |
| 2005/0200371 A1* | 9/2005 | Yakymyshyn et al. | 324/753 |
| 2006/0022154 A1* | 2/2006 | Schmitkons et al. | 250/495.1 |
| 2006/0127594 A1* | 6/2006 | Siegel | 427/508 |
| 2006/0204670 A1* | 9/2006 | Siegel | 427/487 |
| 2007/0026189 A1* | 2/2007 | Abrams | 428/90 |
| 2007/0111573 A1* | 5/2007 | Seymour | 439/180 |
| 2007/0182307 A1* | 8/2007 | Taguchi et al. | 313/484 |
| 2007/0187027 A1 | 8/2007 | Tausch et al. | |
| 2007/0187612 A1* | 8/2007 | Inoue et al. | 250/372 |
| 2007/0227670 A1* | 10/2007 | Kobayashi et al. | 156/379.6 |
| 2008/0023639 A1* | 1/2008 | Kawasaki et al. | 250/372 |
| 2008/0225270 A1* | 9/2008 | Senga et al. | 356/51 |
| 2009/0032112 A1* | 2/2009 | Teach et al. | 137/15.19 |
| 2009/0091045 A1* | 4/2009 | Tanikawa et al. | 257/791 |
| 2009/0102882 A1* | 4/2009 | Silverbrook et al. | 347/20 |
| 2009/0134414 A1* | 5/2009 | Li et al. | 257/98 |
| 2009/0162667 A1* | 6/2009 | Radkov | 428/426 |
| 2009/0213200 A1* | 8/2009 | Sugai | 347/102 |
| 2009/0267094 A1* | 10/2009 | Wei et al. | 257/98 |
| 2009/0294692 A1 | 12/2009 | Bourke, Jr. et al. | |
| 2009/0315041 A1* | 12/2009 | Fujita et al. | 257/81 |
| 2009/0321758 A1* | 12/2009 | Liu et al. | 257/98 |
| 2010/0134747 A1* | 6/2010 | Tashiro et al. | 349/153 |

* cited by examiner

METHODS FOR ASSEMBLING ELECTRONIC DEVICES BY INTERNALLY CURING LIGHT-SENSITIVE ADHESIVE

BACKGROUND

This relates generally to manufacturing techniques, and more particularly, to methods for forming assemblies using adhesive.

Adhesives are widely used in manufacturing. For example, electronic devices often include housings and structures that are attached to each other with pressure sensitive adhesive. In some situations it is difficult to use pressure sensitive adhesive to attach structures to each other. For example, if two parts must slide past each other during assembly, it may be necessary to attach the parts to each other using liquid adhesive rather than a layer of pressure sensitive adhesive. The liquid adhesive can flow during the assembly process and will not cause the two parts to bind to each other prematurely, whereas a layer of pressure sensitive adhesive might cause the two parts to become stuck before they have reached their proper positions.

A variety of liquid adhesives are available. Some glues cure chemically. For example, two-part epoxies and methyl methacrylate (MMA) adhesives cure upon mixing resin with hardener. Cyanoacrylate (CA) adhesive is activated by exposure to moisture. Other glues are cured by application of elevated temperatures. Curing mechanisms such as these often produce undesirable outgassing and can be difficult to control.

Satisfactory control and minimal outgassing can be achieved by using adhesives that are cured by application of ultraviolet (UV) light. For example, ultraviolet-light-cured (UV) epoxy can be used to attach metal and plastic parts in an electronic device. In a typical manufacturing process, uncured UV epoxy is applied to structures that are to be attached to each other. Once the structures are in their desired positions, UV light from a UV lamp is applied to the UV epoxy. This cures the UV epoxy.

In some product designs, it is awkward or impossible to expose the UV epoxy using a UV lamp. For example, if the UV epoxy is located in an interior portion of an assembly, the walls of the assembly will block light from the UV lamp.

To allow UV epoxy to be used to assemble parts where the UV epoxy is located in the interior of the assembly, holes are formed in the parts. During manufacturing, a technician can insert a UV light wand into the interior portion of the assembly through the holes. The internal application of UV light using a UV wand requires the use of holes in the assembly that are large enough to accommodate the UV wand. The holes may be unsightly and may reduce the ability of the assembly to withstand environmental exposure to dust and moisture.

It would therefore be desirable to be able to provide improved techniques for assembling structures using light-sensitive adhesives.

SUMMARY

Assemblies of structures such as electronic device assemblies may be formed using light-cured liquid adhesive such as ultraviolet-light-cured adhesive. Light sources that are part of the assemblies may produce light for curing the light-cured adhesive.

The light sources that are used in curing the adhesive may be ultraviolet-light light-emitting diodes that are mounted to a substrate. The substrate may be mounted to an assembly formed from a number of structures. The structures that are used to form the assembly may be housing structures, internal device members, subassemblies, or other structures.

The structures may be connected to each other to form an assembly having an interior cavity within which the substrate and light-emitting diodes are mounted. The light-emitting diodes may also be connected to other portions of an assembly.

A connector may be included in the assembly. The connector may have input-output pins. Conductive paths may couple the input-output pins to the light-emitting diodes in the cavity.

A tool may be used to apply signals to the light-emitting diodes to activate the light-emitting diodes through the connector. The light-emitting diodes may produce light that cures the adhesive inside the cavity. After the adhesive has been cured, the light-emitting diodes may be disabled by blowing a fuse in the assembly.

Further features of the invention, its nature and various advantages will be more apparent from the accompanying drawings and the following detailed description of the preferred embodiments.

DETAILED DESCRIPTION

Adhesive is widely used in connecting structures together. For example, electronic devices such as computers, cellular telephones, media players, and other electronic equipment often contains parts that are connected to each other using layers of liquid adhesive. Liquid adhesive allows parts to be moved relative to each other as part of the assembly process. For example, parts may slide with respect to each other before the adhesive has cured. Once the adhesive has cured, the parts become secured to one another and can be used in a finished product.

Adhesives can be activated chemically, thermally, or using light. For example, chemically activated two-part adhesives are available that have a hardener and a resin. When the hardener is mixed with the resin, a chemical reaction is created that cures the adhesive. Thermal curing typically involves raising an adhesive above room temperature. This type of curing process often produces undesirable outgassing and can be difficult to control.

As a result, adhesives are sometimes used that are cured by application of light. In a typical arrangement, ultraviolet (UV) light is applied to a UV-cured adhesive such as UV epoxy. It can be difficult or impossible to use this approach when the UV epoxy is located on the inside of an assembly. UV light wands can sometimes be inserted through holes in an assembly to reach the interior of the assembly. This allows UV light to be applied to UV adhesive within the assembly, but requires that holes be formed. The presence of the holes in parts of a device can adversely affect device aesthetics and structural integrity.

To overcome these shortcomings of conventional adhesive curing techniques, an assembly may be provided with an internal light source. Liquid adhesive may be applied to the structures that make up the assembly. When the liquid adhesive and the structures that make up the assembly are in proper position, the internal light source may be turned on to produce light. The light can cure the adhesive from within the assembly. This obviates the need to from holes in the assembly to accommodate an external light source such as a UV wand. Once the adhesive has been cured, the light source can be deactivated. If desired, a fuse may be blown or a device may otherwise be altered to prevent subsequent activation of the light source.

Figure 1A:
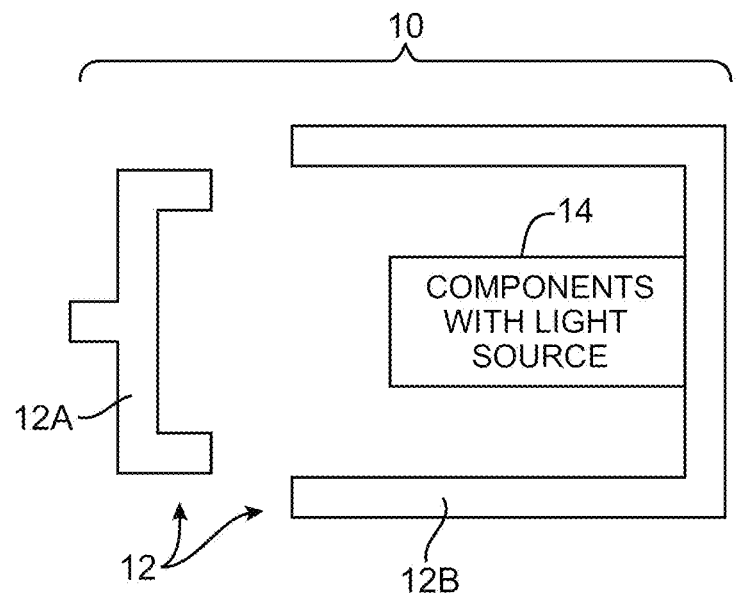
FIG. 1A is an exploded cross-sectional side view of an illustrative assembly having internal components that include a light source for curing adhesive in accordance with an embodiment of the present invention.

An illustrative assembly of the type that may be provided with an internal adhesive-curing light source is shown in FIG. 1A. As shown in the exploded view of illustrative assembly 10 of FIG. 1A, assembly 10 may contain multiple structures such as structures 12A and 12B and components 14.

In general, any suitable number of structures may be assembled together using adhesive (e.g., two structures, more than two structures, three structures, more than three structures, four structures, more than four structures, etc.). The structures can be attached together to form a completed device (e.g., a product that is sold to an end user) or may be used to form a part of a device (e.g., a structure to which additional components are added before the structure is complete and ready to be sold to a user). Structures that are attached together with adhesive are sometimes referred to herein as parts, members, structures, pieces, components, housings, etc. The resulting assemblage of parts may sometimes be referred to as an assembly, a device, a product, an electronic device (e.g., a completed assembly), a structure, etc.

The structures from which assembly 10 is formed may include a light source (shown as part of components 14 in FIG. 1A). During manufacturing, adhesive may be applied to the structures of assembly 10. The light source in components 14 may then be activated to cure the adhesive. After curing, the light source may remain as part of the assembly.

In the FIG. 1A example, structures 12A and 12B are structures that, when assembled, form an enclosure that surrounds internal components 14. Structures 12A and 12B may, for example, be housing structures or other structures that have sidewalls. When structures 12A and 12B are attached to each other, the sidewalls of structures 12A and 12B may form a substantially enclosed internal cavity. Light source 14 may be located within the internal cavity and may remain within the internal cavity after the adhesive has been cured. The shapes and sizes of structures 12A and 12B are merely illustrative. In general, the structures from which assembly 10 is formed may have any suitable configuration.

If desired, the light source may be located on an external portion of an assembly or may be used in curing adhesive in an assembly that does not contain a fully enclosed cavity. Because internally located light sources can be particularly helpful in curing light-cured adhesive in internal cavities (because other arrangements may be impossible to use), illustrative arrangements in which adhesive-curing light sources 14 are located in internal locations are sometimes described herein as an example. This is, however, merely illustrative. Light source 14 may be mounted on an interior or an exterior surface of an assembly and the assembly in which light source 14 is included may or may not have an internal cavity.

Figure 1B:
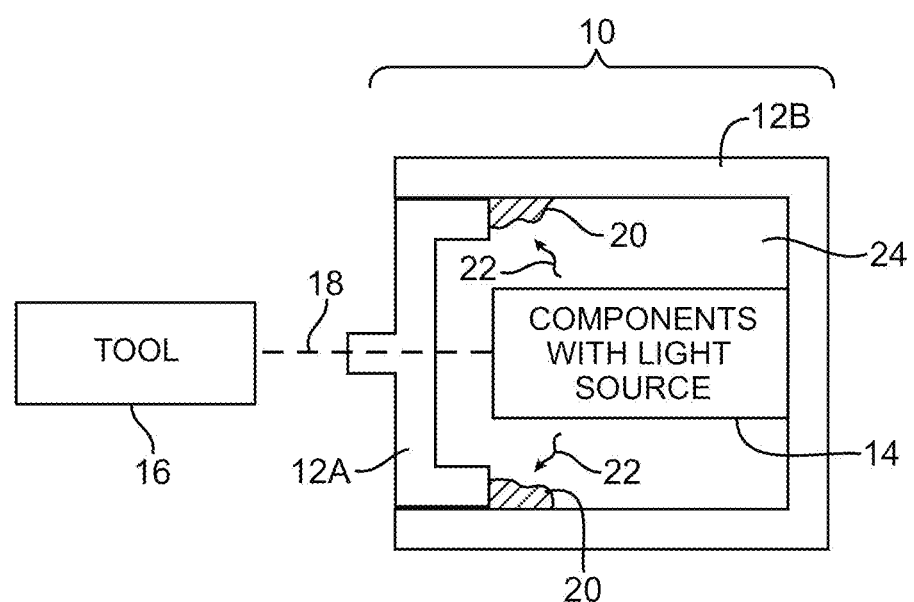
FIG. 1B is a cross-sectional side view of an illustrative assembly of the type shown in FIG. 1A showing how a tool may be connected to the assembly and showing how a light source within the assembly may produce light internally that cures adhesive within the assembly in accordance with an embodiment of the present invention.

Illustrative assembly 10 of FIG. 1A is in an unassembled state because structures 12A and 12B have not been attached to each other. FIG. 1B shows assembly 10 of FIG. 1A in an assembled state in which structure 12A has been mounted within structure 12B. In the FIG. 1B example, the sidewalls of structures 12A and 12B have formed enclosed cavity 24 within which components and light source 14 have been mounted. Adhesive 20 may be placed in contact with both of structures 12A and 12B (e.g., along a seam between structures 12A and 12B, within a gap between opposing planar surfaces of structures 12A and 12B, etc.). Adhesive 20 may, for example, be placed on one or both of structures 12A and 12B when structures 12A and 12B are in an unassembled state (as shown in FIG. 1A). Because uncured adhesive 20 is in liquid form, structures 12A and 12B may be assembled to form the structure shown in FIG. 1B by sliding structure 12A into structure 12B.

As shown in FIG. 1B, tool 16 may supply signals to components and light source 14 over path 18. For example, tool 16 may provide signals to a light source that cause the light source to generate light 22. Light 22 may be directed towards adhesive 20 to cure adhesive 20. Power for turning on light 22 may be supplied internally (e.g., using a battery in cavity 24 or elsewhere in assembly 10) or may be supplied externally from tool 16.

Adhesive 20 may be a light-cured adhesive such as ultraviolet (UV) epoxy or other UV adhesive (sometimes referred to as ultraviolet-light-cured liquid adhesive, ultraviolet-light liquid adhesive, or ultraviolet liquid adhesive). UV epoxy and other UV adhesives are liquid until exposed to UV light. The light source in components and light source 14 may be based on one or more light-emitting diodes (LEDs). For example, the light source may include one or more UV LEDs. Light-emitting diodes may be mounted on a rigid printed circuit board (e.g., a circuit board formed from a rigid substrate such as FR4 or other fiberglass-filled epoxy), a flexible printed circuit board (e.g., a flex circuit formed from a sheet of flexible polymer such as a sheet of polyimide), a rigid flex substrate, or a plastic part or other dielectric structure that serves as a support.

Multiple components may be mounted on a common substrate in assembly 10. For example, components 14 may include integrated circuits, switches, capacitors, inductors, resistors, and other circuitry that are mounted to the same printed circuit board to which the UV LED light source is mounted. The substrate may be mounted to structures such a structures 12A and 12B (e.g., using support structures such as frame structures to which the substrate may be attached with screws, other fasteners, or adhesive, etc.).

Path 18 may be formed by connecting wires or other conductive paths to the light source of assembly 10. For example, a cable may be temporarily attached between tool 16 and assembly 10. Tool 16 may include a power source and control circuitry (e.g., tool 16 may be based on a computer or other control unit that has a controllable output port through which power and control signals may be provided). With one suitable arrangement, path 18 may be formed using a connector port that is part of assembly 10. The connector port may, for example, have an associated connector such as a 30-pin connector, a universal serial bus (USB) connector, a memory card slot connector, a connector for other removable media or cables, etc.

Figure 2:
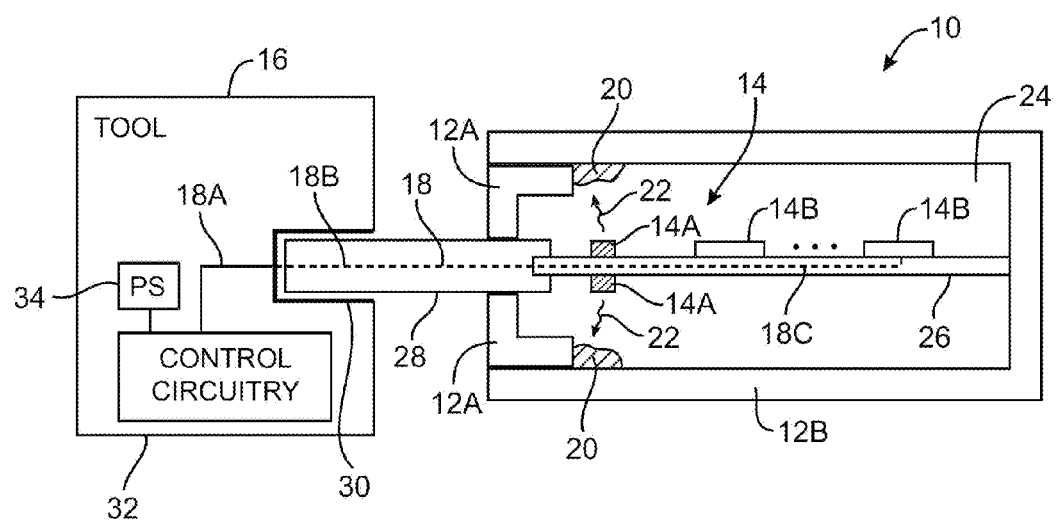
FIG. 2 is a cross-sectional side view of a tool connected to an assembly showing how the tool may deliver signals to a light source within the assembly through a connector to which the tool is engaged to produce light that cures adhesive within the assembly in accordance with an embodiment of the present invention.

FIG. 2 shows how tool 16 may include control circuitry such as control circuitry 32 that applies signals to assembly 10 during manufacturing operations. Tool 16 may have a power source such as power supply 34. Power supply 34 may be, for example, an alternating current (AC) to direct current (DC) power converter that produces DC power from an AC line source or a DC-DC converter that produces DC power from a battery (as examples). Control circuitry 32 may supply signals such as power signals from power supply 34 to assembly 10 over path 18. Path 18 may include path segment 18A, path segment 18B, and path segment 18C.

Path segment 18A may be an internal path in tool 16 that connects control circuitry 32 to connector 30. Connector 30 may be a male or female connector in the housing of tool 16 or may be a connector located at the end of a cable that is pigtailed to tool 16. As shown in FIG. 2, connector 30 may mate with connector 28 in assembly 10.

Path 18B may be a path that is associated with connector 28. Connector 28 may be a 30-pin connector, a USB connector, a media card connector, a cable connector, or any other connector associated with assembly 10. Connector 28 may be mounted to structures such as structure 12A and 12B (e.g., device housings or internal support structures), may be attached to printed circuit board substrates or other connectors associated with assembly 10, etc.).

Path 18C may be a path that is formed from conductive lines associated with substrate 26, wires, conductive lines attached to housing structures, conductive paths associated with structures 12A and 12B, etc. The conductive lines of path 18C may be, for example, conductive traces on a printed circuit board substrate or other suitable substrate (e.g., substrate 26).

As shown in FIG. 2, components and light source 14 may include light sources 14A and components 14B. Light sources 14A may be UV LEDs. Components 14B may be integrated circuits and other circuit components mounted to substrate 26. Substrate 26 may be a rigid printed circuit board substrate, a flex circuit, a rigid flex, a plastic support, or other suitable support structure.

After structures 12A and 12B, components 14, and adhesive 20 have been placed in the position shown in FIG. 2, tool 16 may supply signals to assembly 10 that cause LEDs 14A to supply UV light 22 to adhesive 20, thereby curing adhesive 20. Because this curing operation can be performed using light 22 that is generated within interior cavity 24 of assembly 10, LEDs 14A may sometimes be referred to as internal light sources and light 22 may sometimes be referred to as being internally generated. Adhesive 20 may sometimes be referred to as being internally cured by light 22. Once internally generated light 22 or other suitable light has been used to cure adhesive 20, tool 16 may be removed from assembly 10 (i.e., connector 28 of assembly 10 and connector 30 of tool 16 may be disconnected).

Figure 3:
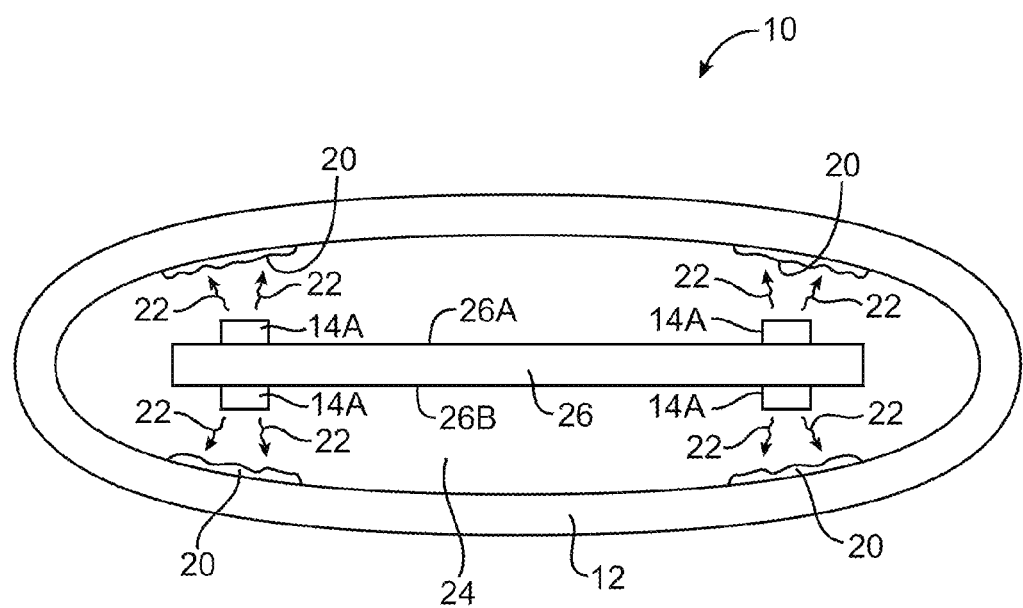
FIG. 3 is a cross-sectional end view of an assembly showing how multiple light sources mounted on a substrate such as a printed circuit board may deliver light to cure adhesive within the interior of the assembly in accordance with an embodiment of the present invention.

There may be one or more light sources such as UV LEDs 14A within cavity 24. For example, there may be two LEDs 14A mounted to upper surface 26A of substrate 26 and two LEDs 14A mounted to lower surface 26B of substrate 26, as shown in the cross-sectional end view of assembly 10 that is shown in FIG. 3. If desired, there may be more LEDs 14A (i.e., more than four LEDs) or fewer than four LEDs 14A in assembly 10. LEDs 14A may all be mounted to the same substrate within cavity 24 (i.e., a common printed circuit board substrate or other substrate) or may be mounted to different substrates (e.g., multiple printed circuit boards). Structures such as structure 12 of FIG. 3 may be formed by structures such as structures 12A and 12B of FIGS. 1 and 2 (as examples).

Figure 4:
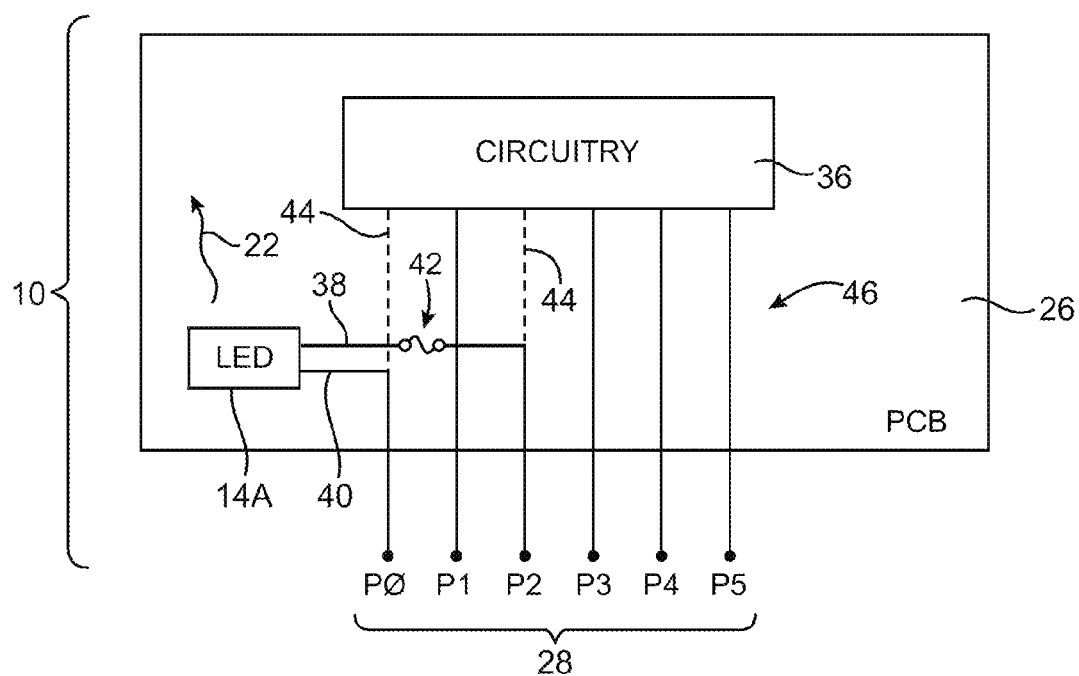
FIG. 4 is a diagram showing how signals can be delivered to a light source on a substrate such as a printed circuit board using input-output pins coupled to the printed circuit board in accordance with an embodiment of the present invention.

Illustrative circuitry that may be provided in assembly 10 to allow adhesive 20 to be cured with internally generated light in assembly 10 is shown in FIG. 4. As shown in FIG. 4, connector 28 may have one or more input-output terminals. In the example of FIG. 4, connector 28 has six input-output terminals (input-output pins P0-P5). In general, connector 28 may have any suitable number of terminals. For example, connector 28 may have 30 contacts (e.g., in a 30-pin connector), may have 10 contacts, may have fewer than 10 contacts, may have two contacts, may have more than 10 contacts, or may have any other suitable number of contacts. Contacts in connector 28 may be connected to contact pads formed from planar metal structures, may be connected to pins formed from elongated prongs, or may be connected to other suitable conductive structures. These structures, which are sometimes referred to as input-output pins may serve as inputs, outputs, or both inputs and outputs for connector 28. When assembly 10 is coupled to tool 16, connector 30 may be connected to connector 28 and some or all of pins 28 may be electrically connected to respective input-output pins in connector 30.

Assembly 10 may include circuitry 36. For example, assembly 10 may be an electronic device or part of an electronic device such as a computer, cellular telephone, media player, or other electronic equipment. Circuitry 36 may include components such as integrated circuits and other components (shown as components 14B in FIG. 2) that are mounted to one or more substrates such as printed circuit board 26. Conductive lines (e.g., traces on printed circuit board 26) may be used to form conductive paths 46 between circuitry 36, the input-output pins of connector 28, and LEDs 14A.

As shown in FIG. 4, light-emitting diodes such as LED 14A may be coupled to input-output pins in connector 28. If, for example, there is a single LED 14A in assembly 10, that LED may be coupled between a pair of the input-output pins in connector 28. If more LEDs are included in assembly 10, more input-output pins may be connected to the LEDs or the LEDs may be wired in parallel or in series. In the FIG. 4 example, LED 14A has a first terminal that is connected to pin P0 by conductive line 40 and second terminal that is connected to pin P2 by conductive line 38. Optional fuse 42 has been interposed in path 38. When tool 16 and assembly 10 are connected to each other, tool 16 can use circuitry 32 to apply signals to pins P0 and P2. The signals that are applied to pins P0 and P2 may be, for example, power supply signals (e.g., a positive power supply voltage and a ground power supply voltage) that are produced by power supply 34 and routed to pins P0 and P2 by control circuitry 32. When power is applied to the terminals of LED 14A, LED 14A produces UV light 22.

The input-output pins of connector 28 to which tool 16 applies signals for controlling LED 14A may be normally unused input-output pins. If for example, normal operation of circuitry 36 involves the use of pins P1, P3, P4, and P5, but does not involved the use of pins P0 and P2, input-output pins P0 and P2 can be used to power LED 14A during UV curing operations, while remaining unused during normal operation of circuitry 36 (e.g., when circuitry 36 is being operated as an integral part of an electronic device that is in use by a user). Because unused pins are not needed by circuitry 36 during normal operation, paths such as paths 44 may remain unconnected (i.e., pins P0 and P2 can be electrically disconnected from circuitry 36).

To ensure that LED 14A is not inadvertently activated after UV adhesive curing operations are complete, fuse 42 may be blown after LED 14A has been used to cure adhesive 20. For example, control circuitry 32 may apply a current to path 38 that exceeds the fuse threshold for fuse 42. When this threshold has been exceeded, fuse 42 will become permanently open circuited, thereby preventing subsequent activation of LED 14A.

Pins P0 and P2 need not be unused pins. For example, pins P0 and P2 may be attached to data input-output terminals in circuitry 36 using conductive lines where indicated by dashed lines 44 of FIG. 4, provided that these data input-output terminals are sufficiently robust to withstand damage when control circuitry 32 supplies pins P0 and P2 with signals during operation of LED 14A.

Figure 5:
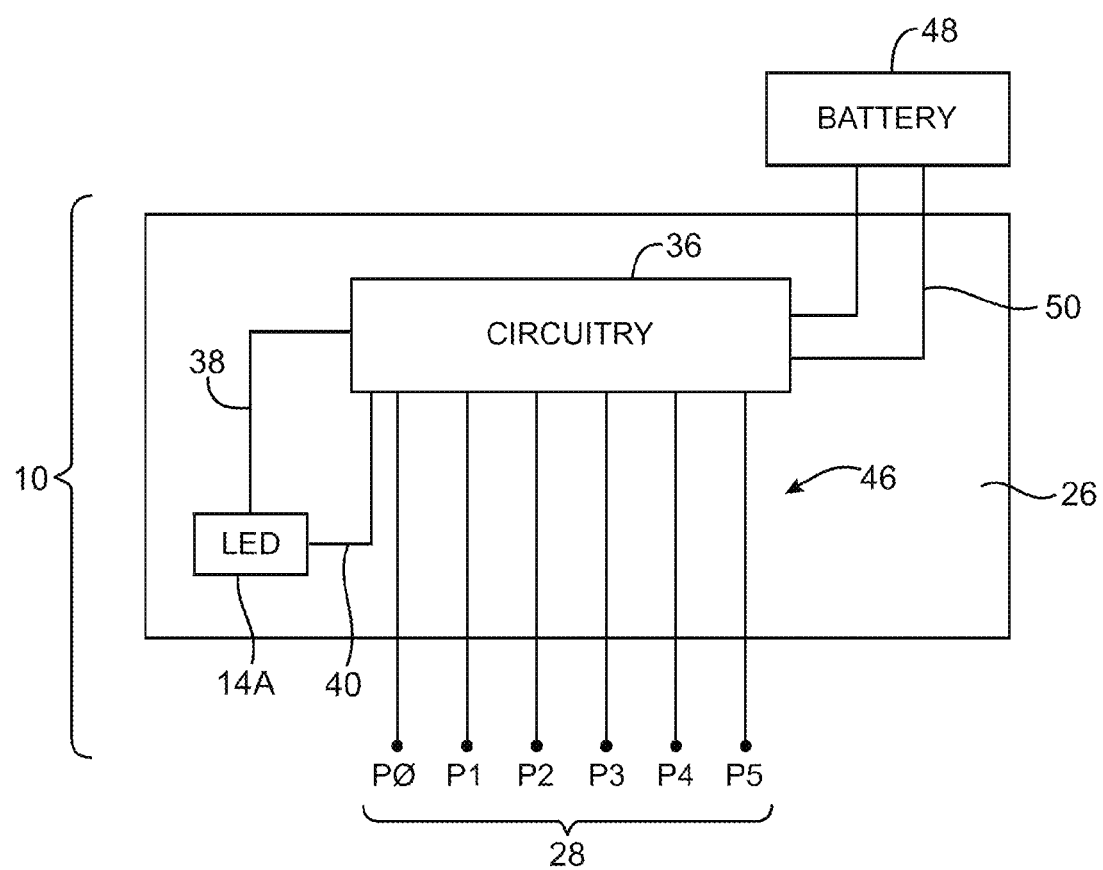
FIG. 5 is a diagram showing how a light source on a printed circuit board can be controlled by delivering signals to the light source through control circuitry on the printed circuit board in accordance with an embodiment of the present invention.

As shown in FIG. 5, LED 14A may be supplied with signals from connector 28 by routing signals through circuitry 36. Paths 46 may be used to connect some or all of input-output pins P0, P1, P2, P3, P4, and P5 (or other suitable input-output pins) to circuitry 36. Circuitry 36 may be connected to LED 14A using paths 38 and 40. In response to signals from control circuitry 32 in tool 16 that are received via paths 46, circuitry 36 may supply signals to LED 14A over paths 38 and 40 that turn on LED 14A. To prevent LED 14A from being activated after adhesive 20 has been cured, circuitry 36 may blow a fuse, set a non-volatile memory bit, or otherwise disconnect paths 38 and 40 from connector 28 after LED 14A has been used to cure adhesive 20. Inadvertent operation of LED 14A may also be prevented by providing circuitry 36 with a security mechanism (e.g., by requiring that circuitry 36 be activated by a particular pattern of signals from connector 28 before signals will be applied by circuitry 36 to LED 14A).

In a typical scenario, tool 16 may supply LEDs such as LED 14A of FIGS. 4 and 5 with power (e.g., from power supply 34). If desired, power may also be supplied from a power supply that is internal to assembly 10 or that is otherwise associated with a device or structure into which assembly 10 is being incorporated. For example, assembly 10 (or a device into which assembly 10 is incorporated), may include a battery such as battery 48 that is coupled to circuitry 36 by power supply paths 50. During normal operation of assembly 10 in a device, battery 48 may power circuitry 36 (e.g., to display images for a user on a display, to play audio for a user, to control other operations in an electronic device, etc.). During assembly operations in which structures such as structures 12A, 12B, components and light source 14, and adhesive 20 are being assembled to form a finished assembly, circuitry 36 may route battery power from battery 48 to LED 14A over paths 38 and 40.

Tool 16 may control the application of power from battery 48 to LED 14A. For example, tool 16 may supply control signals to circuitry 36 using connector 28 and paths 46. In response to the control signals received from tool 16, circuitry 36 may supply power from battery 48 to LED 14A.

If desired, circuitry 36 may supply power from an internal power source such as battery 48 to LED 14A without the need to be connected to an external controller such as tool 16. For example, a technician may run a program or other code on circuitry 36. This code may direct circuitry 36 to power LED 14A from battery 48 for a particular amount of time (e.g., 30 seconds or several minutes as examples). While LED 14A is being powered in this way, internally generated UV light 22 is being applied to adhesive 20 to cure adhesive 20. Once light application is complete, circuitry 36 can deactivate LED 14A.

Figure 6:
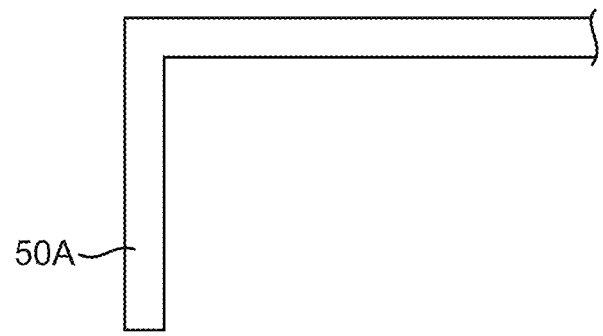
FIG. 6 is a cross-sectional side view of a portion of a structure that may be formed from an opaque first shot of plastic in accordance with an embodiment of the present invention.
Figure 7:
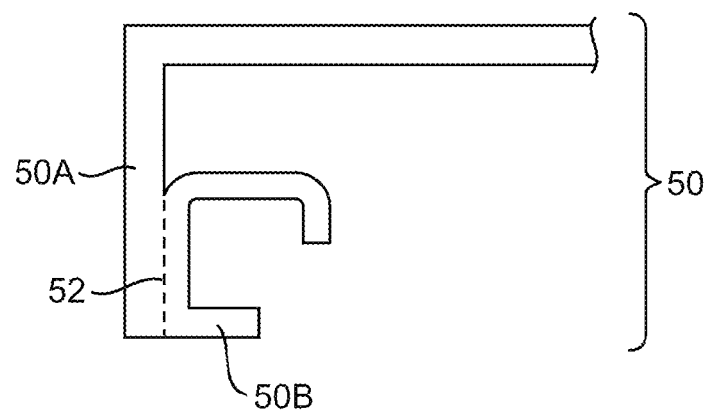
FIG. 7 is a cross-sectional side view of the structure of FIG. 6 after a second shot of plastic such as a shot of transparent plastic has been added to the structure in accordance with an embodiment of the present invention.
Figure 8:
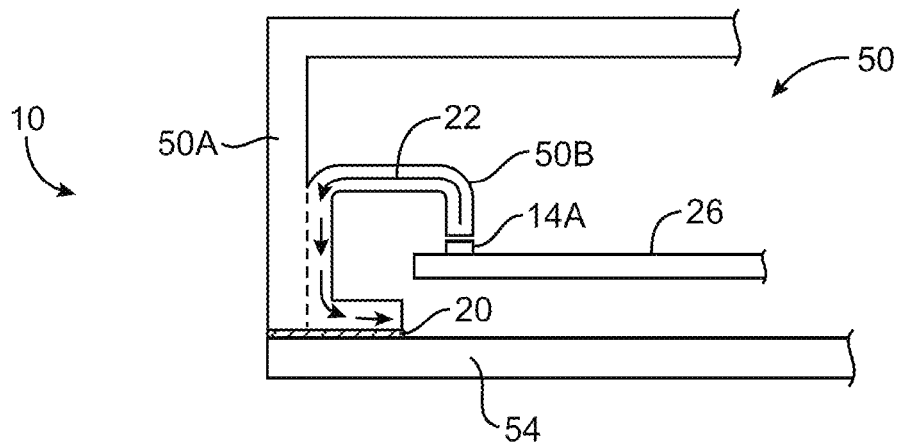
FIG. 8 is a cross-sectional side view of a portion of an assembly that has an internal light source that delivers light through a transparent structure such as a light guiding structure formed from the second shot of plastic of FIG. 7 in accordance with an embodiment of the present invention.

FIGS. 6, 7, and 8 show how structures such as structures 12A and 12B of FIG. 1 may each be formed using two or more materials. A structure for assembly 10 may, for example, be formed using multiple shots of plastic. Each shot of plastic may, if desired, have different properties. For example, one shot of plastic may be opaque and another shot of plastic may be transparent. The opaque shots of plastic may be used on the exterior of assembly 10 (e.g., to form exterior device housing walls). The transparent shots of plastic may be used as internal light pipe structures that help convey UV light 22 from LED 14A to adhesive 20.

A first shot of plastic may, for example, be molded into the shape of plastic shot 50A of FIG. 6. Plastic shot 50A may be opaque. A second shot of plastic such as shot 50B may be added to plastic shot 50A (e.g., using an injection molding tool), as shown in FIG. 7. Because structures 50A and 50B are formed as separate shots in a two-shot molding process, resulting structure 50 is a unitary one-piece part having an opaque portion (50A) and a transparent portion (50B).

As shown in FIG. 8, structure 50 may be attached to structure 54 in assembly 10 using liquid UV adhesive 20. During curing operations, LED 14A on substrate 26 may be activated to produce UV light 22. Because structure 50B is transparent, light 22 may be guided within parts of structure 50B due to the principle of total internal reflection before exiting structure 50B in the vicinity of adhesive 20. In this way, transparent structure 50B may serve as a light pipe that helps to guide and distribute light 22 from light-emitting diode 14A to adhesive 20. Upon reaching adhesive 20, light 22 may be absorbed and distributed within adhesive 20 to cure adhesive 20. Structures such as structure 50 and 54 may serve as structures 12A and 12B of FIGS. 1A, 1B, and 2.

Figure 9:
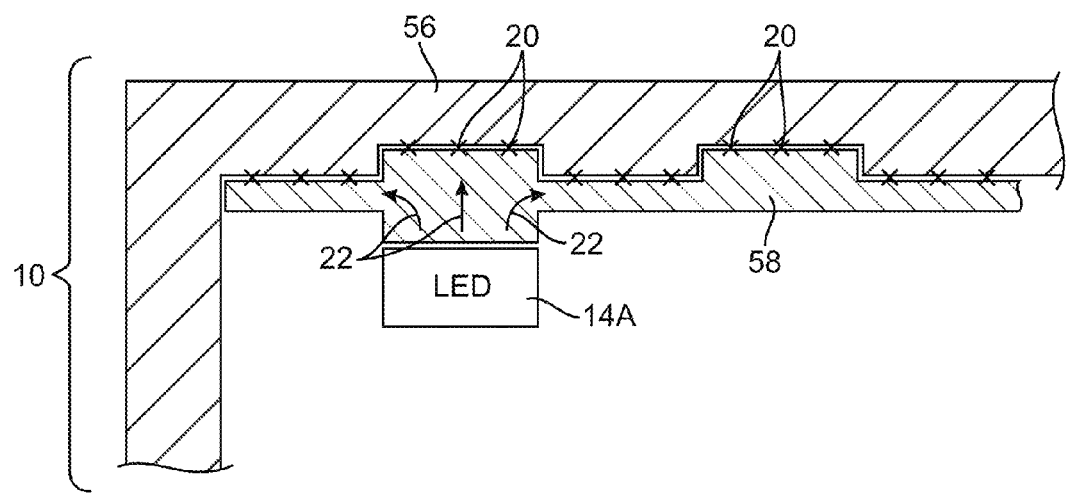
FIG. 9 is a cross-sectional side view of a portion of an assembly that includes an internal light source and a transparent member that delivers light from the light source to cure adhesive within the assembly in accordance with an embodiment of the present invention.
Figure 10:
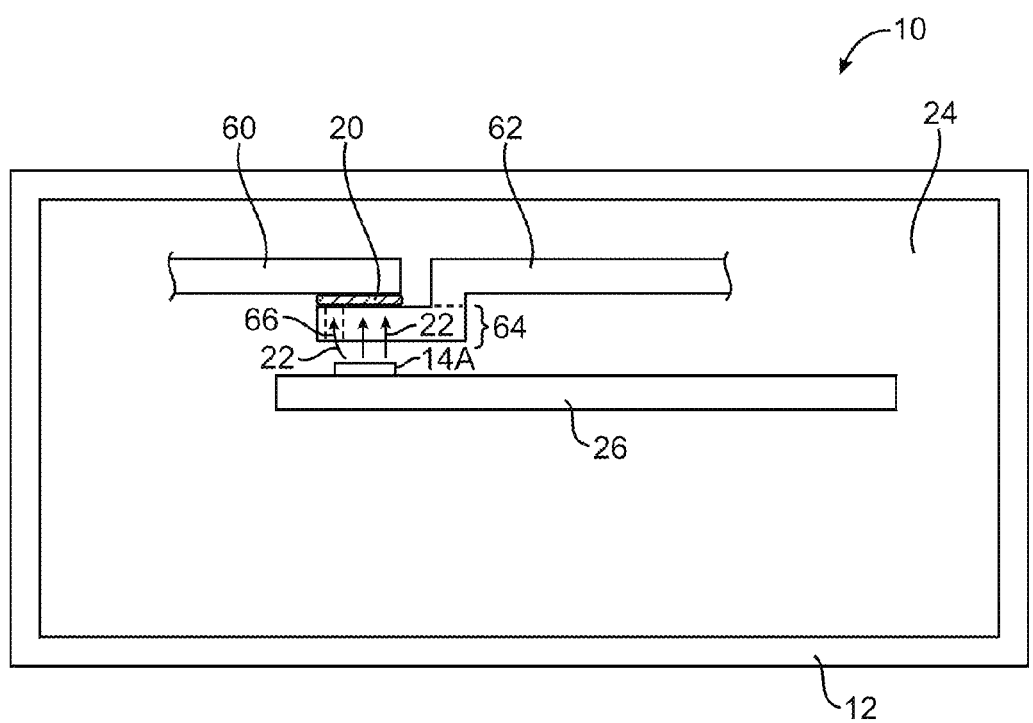
FIG. 10 is a cross-sectional side view of an illustrative assembly that includes an internal light source and a transparent member though which light from a light source reaches a layer of adhesive to attach structures together within the assembly in accordance with an embodiment of the present invention.

Transparent light pipe structures may be formed from transparent plastic (e.g., one shot of a multishot injection-molded part or a single piece of transparent plastic), glass, transparent ceramics, etc. FIG. 9 is a cross-sectional side view showing how light 22 may be distributed using a transparent member such as member 58. Member 58 may be an internal frame structure, a housing structure, or other structure in assembly 10. In the example of FIG. 9, member 58 is transparent, but member 56 is opaque. In general, the structures that are connected to each other using UV-cured adhesive 20 may both be transparent, may both be opaque, or may include some opaque portions and some transparent portions. As shown in FIG. 9, use of a transparent structure such as structure 58 may facilitate distribution of light 22 to adhesive 20 so that adhesive 20 can cure and attach structures 56 and 58 together in assembly 10. In the FIG. 9 example, structure 58 serves as a light pipe that distributes light 22 to a variety of internal locations within assembly 10. Structures such as structure 58 may be elongated or may be compact, may be straight or may have bends, and may or may not have notches and other engagement features (as shown in the FIG. 9 example), As shown in FIG. 10, light 22 from light-emitting diode 14A may cure adhesive that is being used to join internal members in assembly 10 to each other. Assembly 10 may, for example, have a structure such as structure 12 that serves as a housing. Interior structures such as structure 60 and 62 in interior cavity 24 may be joined using adhesive 20 that is cured by light 22 from LED 14A.

In the FIG. 10 example, structure 60 is being joined to structure 62 by adhesive 20. Structure 60 may be opaque or transparent. Structure 62 may also be opaque or transparent. To ensure that light 22 can pass through portion 64 of structure 62, portion 64 of structure 62 may be provided with one or more openings such as opening 66 (e.g., perforations, holes, or other structures that allow light 22 to pass through structure 62. Light may also be allowed to pass by forming portion 64 of structure 62 from a transparent material as described in connection with transparent second shot 50B of FIG. 8. If desired, structures 60 and 62 may be external housing structures.

Figure 11:
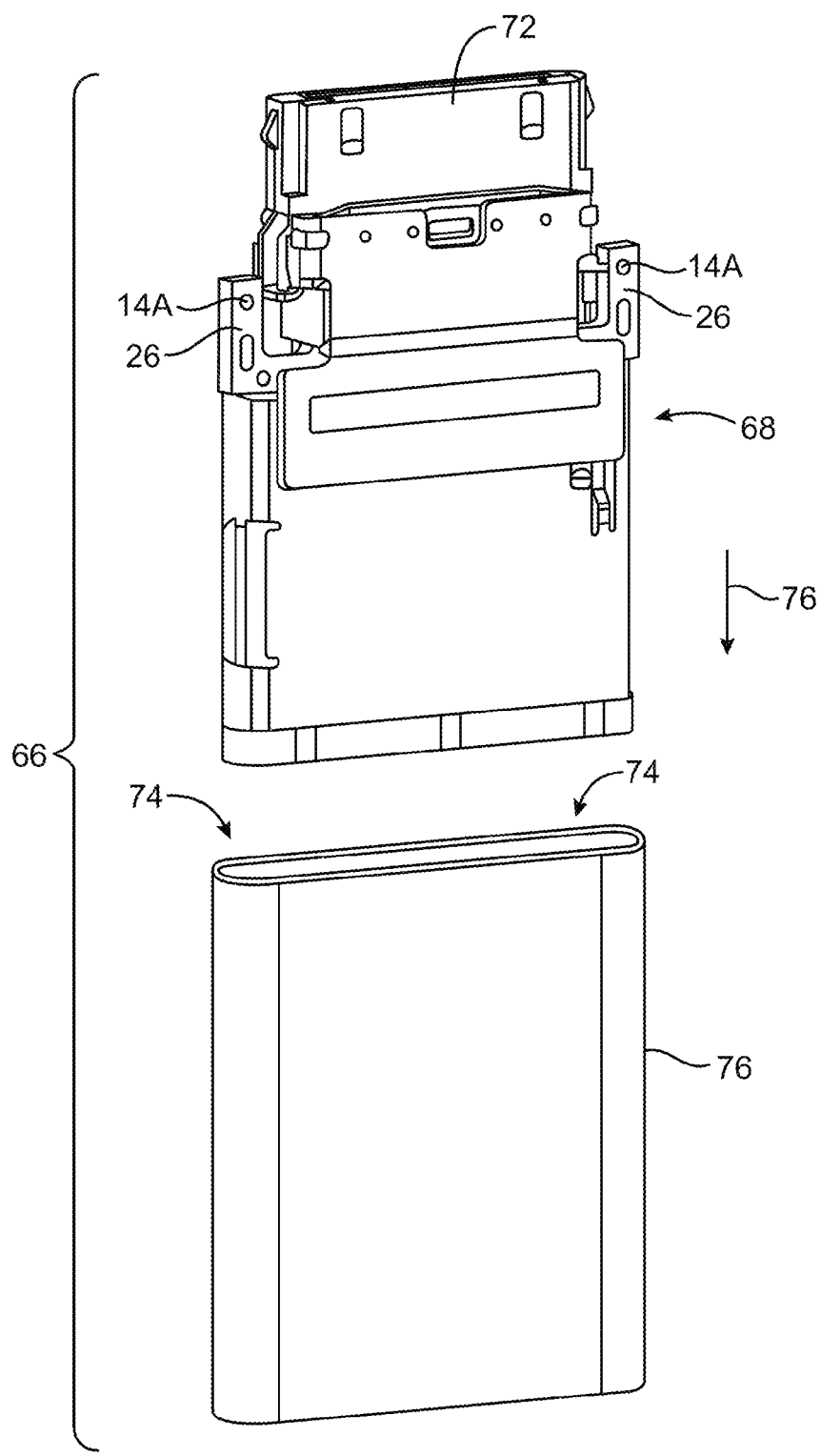
FIG. 11 is an exploded view of parts of an illustrative electronic device containing a printed circuit board on which light sources have been mounted to internally cure adhesive when assembling the parts in accordance with an embodiment of the present invention.

FIG. 11 is a perspective view of housing structures and internal portions of an electronic device (device 66) of the type that may be formed using internally cured adhesive. As shown in FIG. 11, device 66 may have a housing shell such as shell 70 that is formed from plastic, metal, composites, ceramics, or other suitable housing materials (e.g., opaque structures). Shell 70 may be used to house internal device components 68. Components 68 may include integrated circuits and other components (see, e.g., components 14 of FIG. 1A). Light sources such as LEDs 14A may be mounted on components 68 (e.g., on substrate portions 26). Connector 72 may be, for example, a 30-pin connector, a USB connector, or other electrical connector. During assembly, UV adhesive 20 may be placed in regions 74 of shell 70 and/or near LEDs 14A of structures 68. Structures 68 may then be slid into housing shell 70 in direction 76 to produce the arrangement shown in FIG. 12.

Figure 12:
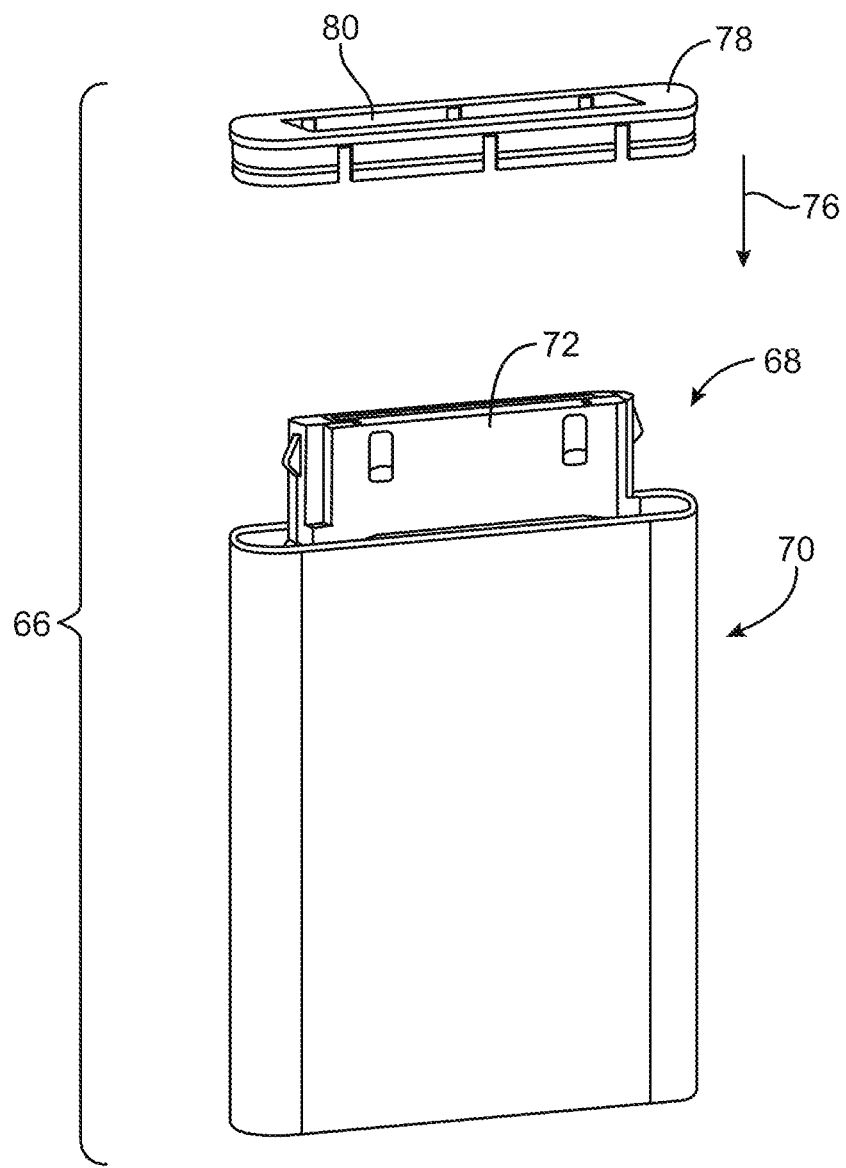
FIG. 12 is an exploded perspective view of an illustrative electronic device of the type shown in FIG. 11 showing an end cap housing structure that may be attached to the electronic device using adhesive that is internally cured by a light source on an internal substrate such as a printed circuit board in accordance with an embodiment of the present invention.
Figure 13:
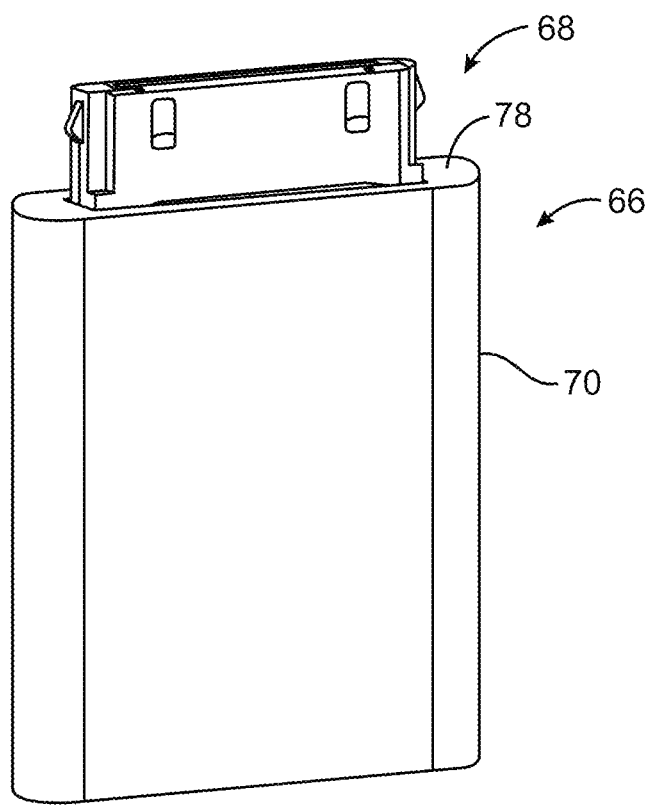
FIG. 13 is a perspective view of an electronic device of the type shown in FIG. 12 after the end cap has been attached to the electronic device using adhesive cured with an internal light source in accordance with an embodiment of the present invention.

As shown in FIG. 12, device 66 may have a cap such as cap 78. As part of the process of assembling device 66, connector 72 may be inserted through hole 80 in cap 78 as cap 78 is inserted into shell 70 in direction 76. Once cap 78 is in place, connector 72 may be inserted into tool 16 as described in connection with FIG. 2. LEDs 14A may be activated to produce light 22. Light 22 may cure adhesive 20 to hold the structures of device 66 together. A perspective view of a finished version of device 66 is shown in FIG. 13.

Figure 14:
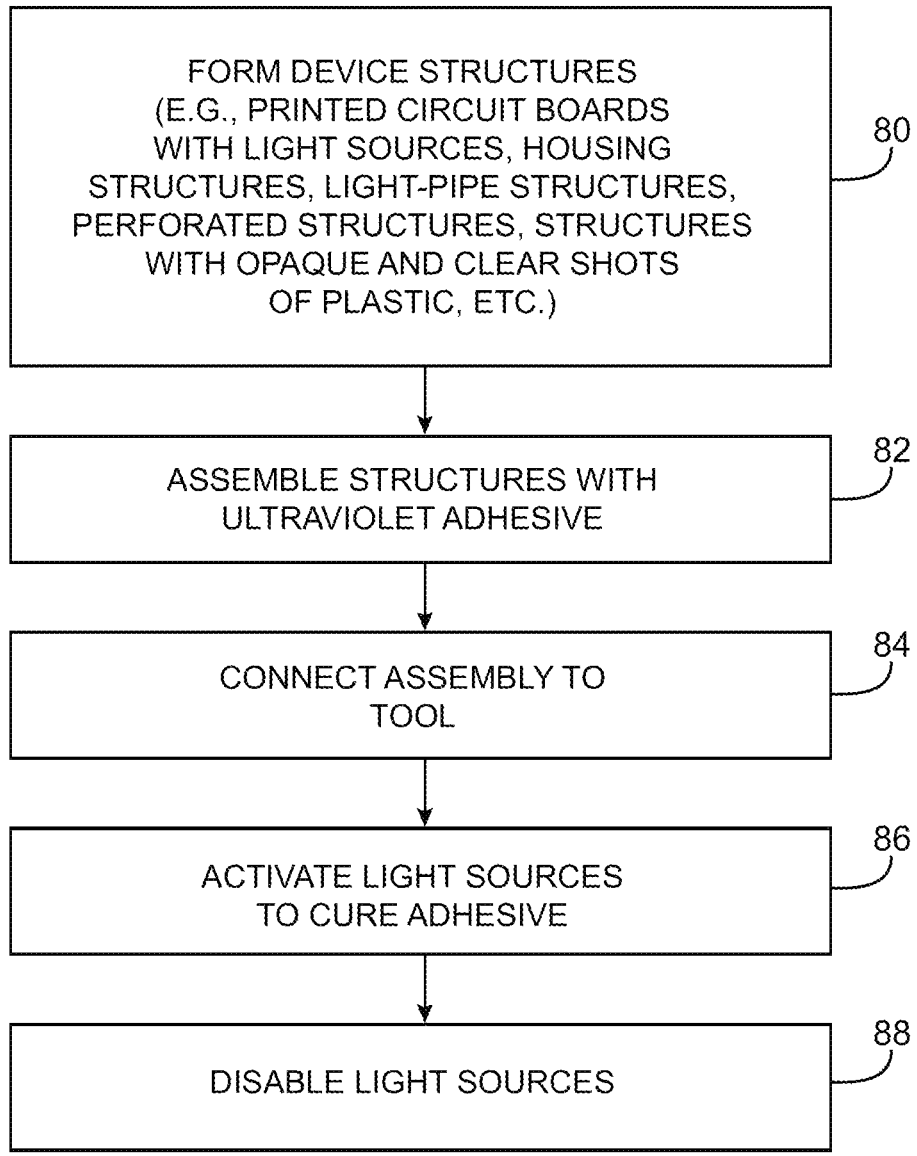
FIG. 14 is a flow chart of illustrative steps involved in using adhesive that is cured from internal light sources to assemble structures in accordance with an embodiment of the present invention.

FIG. 14 shows illustrative steps that may be involved in forming assemblies (e.g., electronic devices, portions of electronic devices, or other groups of structures) by connecting structures with liquid adhesive and applying light from a light source in the assembly. The light source may, for example, be contained in an interior cavity in the assembly such as cavity 24 (FIG. 1B).

At step 80, structures for the assembly may be formed (e.g., printed circuit boards and other substrates 26 may be constructed and populated with LEDs 14A and other components, housing structures and other structures for the assembly may be formed (e.g., using opaque and transparent shots of plastic in an injection molding process, using metal, using composites, etc.).

At step 82, the structures that have been formed may be assembled using UV liquid adhesive 20. For example, structures such as structures 12A and 12B and internal components 14 may be connected together using adhesive 20.

At step 84, the assembly that has been formed may be connected to tool 16. For example, connectors 30 and 28 of FIG. 2 may be coupled together to allow circuitry 32 to supply signals to LEDs 14A in assembly 10.

At step 86, circuitry 32 may supply signals to LEDs 14A to activate LEDs 14A and thereby produce light 20 that cures adhesive 20.

At step 88, LEDs 14A may optionally be disabled (e.g., by blowing a fuse such as fuse 42 of FIG. 4).

The foregoing is merely illustrative of the principles of this invention and various modifications can be made by those skilled in the art without departing from the scope and spirit of the invention. The foregoing embodiments may be implemented individually or in any combination.

What is claimed is:
1. An electronic device, comprising:
a first housing structure;
electronic components within the first housing structure including an ultraviolet light-emitting diode;
a second housing structure that is connected to the first housing structure and that forms an interior cavity within the electronic device in which the ultraviolet light-emitting diode is located; and ultraviolet-light-cured epoxy that is contained within the interior cavity and that attaches the first and second housing structures.

2. The electronic device defined in claim 1 further comprising a connector having input-output pins and conductive lines that couple at least some of the input-output pins to the ultraviolet light-emitting diode.

3. The electronic device defined in claim 2 further comprising a fuse interposed in at least one of the conductive lines.

4. The electronic device defined in claim 1, wherein the interior cavity is an enclosed interior cavity, and wherein the ultraviolet-light-cured epoxy is completely contained within the enclosed interior cavity.

5. The electronic device defined in claim 1, wherein the ultraviolet light-emitting diode is not in direct contact with the ultraviolet-light-cured epoxy.

6. An electronic device, comprising:
a first component;
a second component;
a substrate;
light-cured adhesive interposed between the first and second components, wherein the light-cured adhesive is in contact with the first and second components; and
a plurality of light sources on the substrate, wherein the light-cured adhesive has been cured using the plurality of light sources on the substrate, wherein the first and second components and the substrate remain a part of the electronic device after the light-cured adhesive has been cured.

7. The electronic device defined in claim 6, wherein the substrate comprises a printed circuit board.

8. The electronic device defined in claim 7, further comprising:
a connector; and
a conductive path on the substrate interposed between the connector and the plurality of light sources on the substrate.

9. The electronic device defined in claim 8, further comprising at least one current control component on the conductive path.

10. The electronic device defined in claim 9, wherein the at least one current control component comprises a fuse.

11. The electronic device defined in claim 10, wherein the fuse comprises a blown fuse.

12. The electronic device defined in claim 11, wherein the connector comprises at least one input-output pin coupled to the conductive path and wherein the blown fuse is located on the conductive path between the input-output pin and the plurality of light sources.

13. The electronic device defined in claim 7, further comprising at least one integrated circuit on the printed circuit board.

14. The electronic device defined in claim 7, wherein the plurality of light sources comprises a plurality of light-emitting-diodes.

15. The electronic device defined in claim 7, wherein the printed circuit board has first and second opposing surfaces and wherein the plurality of light sources comprises a first plurality of light sources attached to the first surface and a second plurality of light sources attached to the second surface.

16. The electronic device defined in claim 7, wherein the first component comprises a portion of a housing and wherein the portion of the housing includes an opaque portion and a transparent portion.

17. The electronic device defined in claim 16, wherein at least one of the plurality of light sources is mounted to the printed circuit board adjacent to the transparent portion of the portion of the housing.

18. The electronic device defined in claim 17, wherein the light-cured adhesive is formed in contact with the transparent portion of the portion of the housing.

19. The electronic device defined in claim 6, wherein at least one of the first and second components comprises a transparent structure configured to transmit light emitted by at least one of the plurality of light sources to the light-cured adhesive.

20. An electronic device, comprising:
a first housing structure;
electronic components within the first housing structure including an ultraviolet light-emitting diode;
a second housing structure that is connected to the first housing structure and that forms an interior cavity within the electronic device in which the ultraviolet light-emitting diode is located;
ultraviolet-light-cured epoxy that is contained within the interior cavity and that attaches the first and second housing structures; and
a light pipe that guides light emitted by the ultraviolet light-emitting diode to the ultraviolet-light-cured epoxy.

* * * * *